US 6,617,257 B2

United States Patent
Ni et al.

(10) Patent No.: US 6,617,257 B2
(45) Date of Patent: Sep. 9, 2003

(54) METHOD OF PLASMA ETCHING ORGANIC ANTIREFLECTIVE COATING

(75) Inventors: Tuqiang Ni, Fremont, CA (US); Weinan Jiang, San Jose, CA (US); Conan Chiang, Los Altos, CA (US); Frank Y. Lin, Fremont, CA (US); Chris Lee, Kensington, CA (US); Dai N. Lee, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/820,737

(22) Filed: Mar. 30, 2001

(65) Prior Publication Data

US 2002/0182881 A1 Dec. 5, 2002

(51) Int. Cl.$^7$ ................... H01L 21/302; H01L 21/461
(52) U.S. Cl. ................... 438/725; 438/714; 438/710; 438/700
(58) Field of Search ................... 438/724, 725, 438/9, 714, 717, 709, 710, 700, 702

(56) References Cited

U.S. PATENT DOCUMENTS

| | | |
|---|---|---|
| 5,013,398 A | 5/1991 | Long et al. |
| 5,013,400 A | 5/1991 | Kurasaki et al. |
| 5,021,121 A | 6/1991 | Groechel et al. |
| 5,022,958 A | 6/1991 | Favreau et al. |
| 5,269,879 A | 12/1993 | Rhoades et al. |
| 5,529,657 A | 6/1996 | Ishii |
| 5,595,627 A | 1/1997 | Inazawa et al. |
| 5,611,888 A | 3/1997 | Bosch et al. |
| 5,721,090 A * | 2/1998 | Okamoto et al. ........... 430/313 |
| 5,773,199 A | 6/1998 | Linliu et al. |
| 5,780,338 A | 7/1998 | Jeng et al. |
| 5,820,723 A | 10/1998 | Benjamin et al. |
| 5,827,437 A * | 10/1998 | Yang et al. ................... 216/77 |
| 5,910,453 A | 6/1999 | Gupta et al. |
| 5,914,277 A | 6/1999 | Shinohara |
| 6,039,888 A | 3/2000 | Ha et al. |
| 6,040,248 A | 3/2000 | Chen et al. |
| 6,080,678 A | 6/2000 | Yim |
| 6,090,304 A | 7/2000 | Zhu et al. |
| 6,090,722 A | 7/2000 | Armacost et al. |
| 6,103,631 A * | 8/2000 | Soda et al. ................... 438/714 |
| 6,127,089 A | 10/2000 | Subramanian et al. |
| 6,358,842 B1 * | 3/2002 | Zhou et al. ................... 438/633 |

FOREIGN PATENT DOCUMENTS

| | | |
|---|---|---|
| FR | 2673763 | 9/1992 |
| JP | 10242127 | 9/1998 |
| WO | 99/21217 A | 4/1999 |
| WO | 99/234425 A | 7/1999 |

OTHER PUBLICATIONS

M. Moalem et al., "Low–temperature vapor–phase etching of silicon carbide by dioxygen difluoride", Appl. Phys. Lett. 66 (25), Jun. 19, 1995, pp. 3480–3482.
Notification of Transmittal of the International Search Report or the Declaration dated Jan. 21, 2003 for PCT/US02/06650.
Written Opinion dated Jan. 31, 2003 for PCT/US02/06650.

* cited by examiner

Primary Examiner—Amir Zarabian
Assistant Examiner—Khanh B. Duong
(74) Attorney, Agent, or Firm—Burns, Doane, Swecker & Mathis, LLP

(57) ABSTRACT

A semiconductor manufacturing process wherein an organic antireflective coating is etched with an $O_2$-free sulfur containing gas which provides selectivity with respect to an underlying layer and/or minimizes the lateral etch rate of an overlying photoresist to maintain critical dimensions defined by the photoresist. The etchant gas can include $SO_2$ and a carrier gas such as Ar or He and optional additions of other gases such as HBr. The process is useful for etching 0.25 micron and smaller contact or via openings in forming structures such as damascene structures.

20 Claims, 5 Drawing Sheets

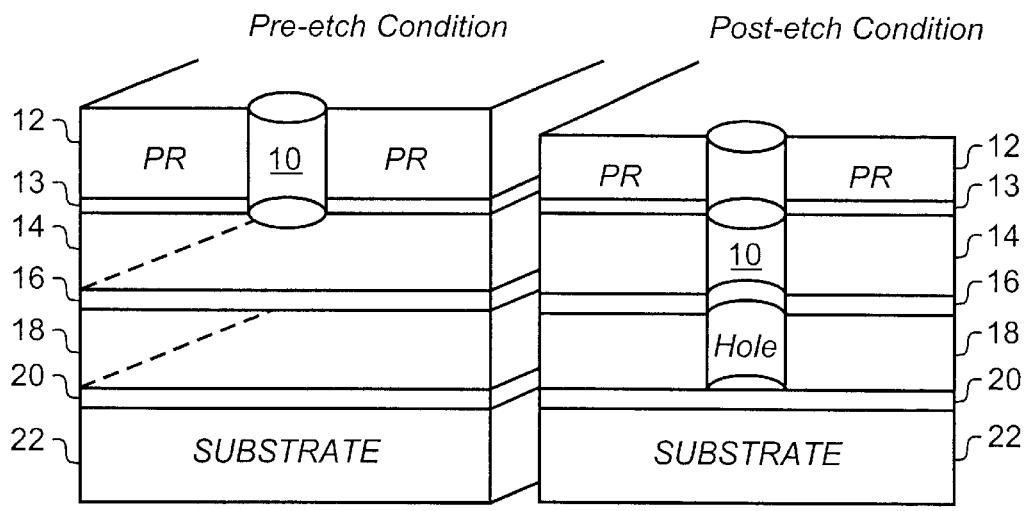
FIG. 1A     FIG. 1B
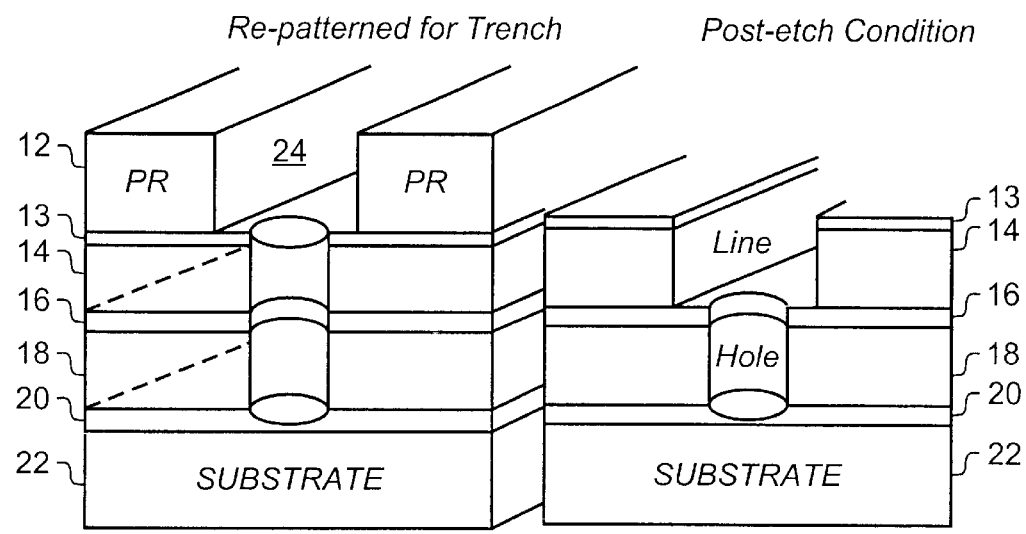
FIG. 1C     FIG. 1D

*Pre-etch Condition*

*Post-etch Condition*

METHOD OF PLASMA ETCHING ORGANIC ANTIREFLECTIVE COATING

FIELD OF THE INVENTION

The present invention relates to an improved method for plasma etching antireflective coatings in the fabrication of integrated circuits.

BACKGROUND OF THE INVENTION

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627; 5,611,888; and 5,780,338. The plasma etching can be carried out in medium density reactors such as the parallel plate plasma reactor chambers described in the '398 patent or the triode type reactors described in the '400 patent or in high density reactors such as the inductive coupled reactors described in the '657 patent. U.S. Pat. No. 6,090,304 discloses a method of plasma etching semiconductor substrates in a dual frequency plasma reactor wherein a first radiofrequency (RF) source is coupled to a top showerhead electrode through an RF matching network and a bottom electrode (on which a semiconductor wafer is supported) is coupled to a second RF source through a second matching network.

In processing semiconductor wafers, it is conventional to provide an organic bottom antireflective coating (BARC) beneath a photoresist for purposes of minimizing optical reflection of the radiation used to develop a pattern of openings (such as contact holes) in the photoresist. It is conventional to refer to an organic arc as a BARC whereas an inorganic ARC is referred to as a "dielectric" ARC or DARC. It is also conventional to plasma etch the BARC through the openings formed in the resist in order to transfer the photoresist pattern to the BARC. Etch gas mixtures for plasma etching organic ARC materials are disclosed in U.S. Pat. Nos. 5,773,199; 5,910,453; 6,039,888; 6,080,678; and 6,090,722. Of these, the '199 patent discloses a gas mixture of $CHF_3+CF_4+O_2+Ar$; the '453 patent discloses gas mixtures of $N_2+He+O_2$ or $N_2+O_2$ or $N_2+He$; the '888 discloses a gas mixture of $O_2+CO$; the '678 patent discloses a gas mixture of $O_2+SO_2$; and the '722 patent discloses a gas mixture of $(C_2F_6+Ar$.

As device geometries become smaller and smaller, the need for high etch selectivity is even greater in order to achieve plasma etching openings through antireflective coatings while preserving critical dimensions (CD). Accordingly, there is a need in the art for a plasma etching technique which provides high etch selectivity and/or which etches such layers at a desirable rate.

SUMMARY OF THE INVENTION

The invention provides a method of etching an organic antireflective coating with selectivity to an underlying layer, comprising supporting a semiconductor substrate in a plasma etch reactor, the substrate including an organic antireflective coating over an underlying layer, and energizing an $O_2$-free etchant gas into a plasma state and etching openings in the organic antireflective coating, the etchant gas comprising a sulfur-containing gas and a carrier gas.

According to a preferred embodiment, the openings comprise vias, contacts, and/or trenches of a dual damascene, self-aligned contact or self-aligned trench structure. The openings can also comprise a pattern of conductor lines for a gate electrode. The organic antireflective coating can be a polymer film underlying a patterned photoresist. Because the etchant gas chemistry can passivate sidewalls of openings in the photoresist, the etchant gas minimizes the lateral etch rate of the photoresist to thereby maintain critical dimensions defined by the photoresist.

The plasma etch reactor can comprise an ECR plasma reactor, an inductively coupled plasma reactor, a capacitively coupled plasma reactor, a helicon plasma reactor or a magnetron plasma reactor. A preferred plasma etch reactor is an inductively coupled plasma reactor including a planar antenna which couples RF energy into the chamber through a dielectric window.

The sulfur-containing gas is preferably $SO_2$ and the preferred carrier gas is He or Ar. The etchant gas can further comprise HBr. During the etching step, pressure in the plasma etch reactor can be up to 100 mTorr and/or temperature of the substrate support can be −20° C. to +80° C. As an example, the sulfur-containing gas can comprise $SO_2$ supplied to the plasma etch reactor at a flow rate of 5 to 200 sccm and the carrier gas can comprise He or/or Ar supplied to the plasma etch reactor at a flow rate of 5 to 150 sccm. If HBr is included in the etch gas, the HBr can be supplied to the plasma etch reactor at a flow rate of 5 to 150 sccm. More preferably, the flow rates of $SO_2$, HBr and He are 5 to 200 sccm $SO_2$, 10 to 50 sccm HBr and 50 to 150 sccm He.

The etching step can be followed by additional etching steps and subsequent filling of the openings with metal. The method of the invention can also include steps of forming the photoresist layer on the substrate, patterning the photoresist layer to form a plurality of openings followed by etching a metallization pattern of conductor lines, via or contact openings in the organic antireflective coating.

BRIEF DESCRIPTION OF THE DRAWINGS

FIGS. 1A–D show schematic representations of a via-first dual-damascene structure which can be etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched;

DETAILED DESCRIPTION OF THE INVENTION

Figures 2A, 2B:
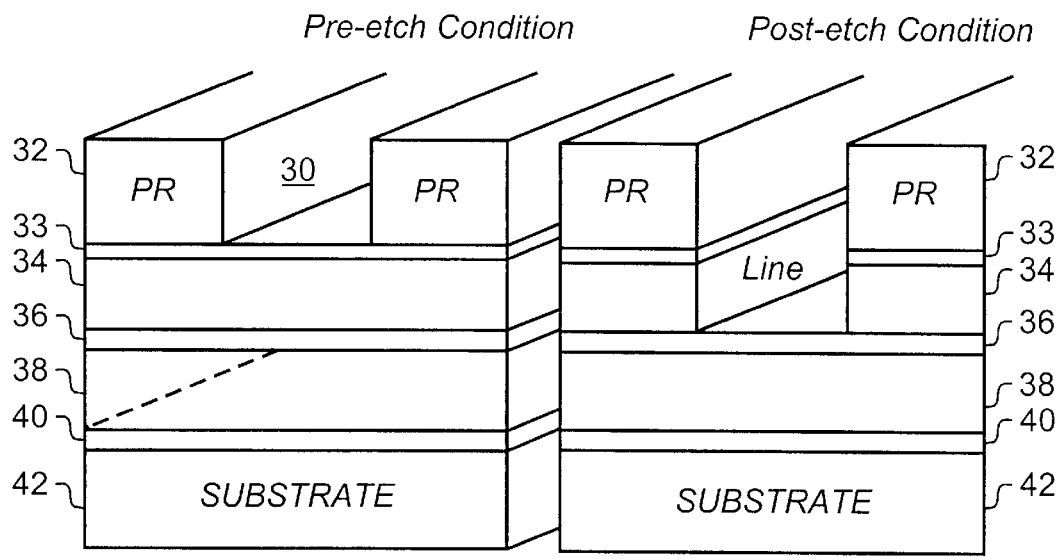
FIGS. 2A–D show schematic representations of a trench-first dual-damascene structure which can be etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched.

The invention provides a semiconductor manufacturing process wherein openings can be plasma etched in a thin organic antireflective coating (BARC) while maintaining critical dimensions defined by an overlying photoresist. The organic antireflective coating is a hydrocarbon film having a preferred thickness of about 200 nm or less. The organic antireflective coating is used to provide better control over the photolithographic process wherein a pattern of openings such as vias, contacts or trenches are formed in the photoresist. In the past, it has been conventional to etch the BARC with $O_2$. However, during plasma etching with $O_2$, the molecular oxygen dissociates into oxygen atoms which laterally etch the overlying photoresist and cause the critical dimension (CD) to change. According to the invention, lateral etching of the photoresist can be minimized by using an $O_2$-free sulfur containing etch gas.

The CD loss in the BARC is undesirable when etching features having small line widths. Use of fluorine containing gases to maintain CD while etching BARC openings can cause profile and uniformity issues due to attack of the underlying layer by fluorine in the plasma. In accordance with the invention, such problems can be avoided by using a sulfur containing etching gas. The sulfur containing gas is preferably $SO_2$ in combination with a carrier gas such as argon or helium. In a preferred embodiment, the etch gas is F-free but can include other halogen gases such as HBr.

The process is carried out by energizing the etch gas into a plasma state and etching openings in the BARC. To minimize CD loss during etching of the BARC, it is desirable to coat the sidewalls of the etched openings in the BARC and overlying photoresist with a protective film. Whereas fluorine containing and $O_2$ containing etch gases can lead to the CD, profile and uniformity problems mentioned above, $SO_2$ offers several advantages as an etch gas. For example, because it is difficult to dissociate the $SO_2$ into harmful oxygen atoms inside the plasma, CD loss can be minimized since less free oxygen atoms are available to attack the photoresist. Further, the $SO_2$ can be used to protect the sidewalls of the openings in the photoresist by forming a protective film thereon. Improvement in uniformity and profile can be achieved because the BARC etch is an ion assisted etch which has selectivity to the underlying dielectric, conductive or semiconductive layer. The selectivity can be obtained because $SO_2$ is absorbed on the surface of the BARC being etched and $O_2$ is released from the $SO_2$ by impinging ions. The released $O_2$ attacks the carbon and hydrogen components of the BARC at the bottom of the openings and when the underlying dielectric layer is reached, the underlying layer is etched at a slower rate than in the case where fluorine containing etch gases are used.

Tests were carried out in a TCP™ inductively coupled high density plasma etch reactor available from Lam Research Corporation, the assignee of the present application. The reactor includes a planar antenna which inductively couples RF energy into the reactor through a dielectric window and a semiconductor substrate being etched is supported on a to bottom electrode which can apply an RF bias to the substrate. In the following table, P represents the vacuum pressure in mTorr in the reactor, TCP™ represents the power in watts applied to the antenna, BP represents the power applied to the bottom electrode, the gas flow rates are listed in units of sccm, D-CD is the CD bias in dense lines in units of nanometers and I-CD is the CD bias in isolated lines in units of nanometers.

TABLE 1

| Run | P | TCP™ | BP  | Ar | He  | $O_2$ | $SO_2$ | HBr | D-CD  | I-CD  |
|-----|---|------|-----|----|-----|-------|--------|-----|-------|-------|
| 1   | 5 | 350  | 50  |    |     | 35    | 35     |     | −37.3 | −55.6 |
| 2   | 5 | 350  | 50  |    | 70  | 20    | 50     |     | −25.3 | −38.4 |
| 3   | 5 | 350  | 70  |    | 70  |       | 35     | 35  | −18.5 | −25.8 |
| 4   | 5 | 350  | 100 |    | 70  |       | 10     | 35  | −14.6 | −10   |
| 5   | 5 | 350  | 100 |    | 70  |       | 10     | 35  | −16.5 | −14.4 |
| 6   | 5 | 350  | 50  |    | 70  |       | 50     |     | −20.1 | −28.5 |
| 7   | 5 | 350  | 150 |    | 70  |       | 50     |     | −12.8 | −14.9 |
| 8   | 5 | 350  | 150 |    | 140 |       | 100    |     | −13.5 | −16.2 |
| 9   | 5 | 350  | 150 |    | 105 |       | 35     |     | −12.5 | −14.9 |
| 10  | 5 | 350  | 150 | 70 |     |       | 50     |     | −13.1 | −13.6 |
| 11  | 5 | 350  | 180 |    | 105 |       | 35     |     | −11.4 | −13.5 |
| 12  | 5 | 350  | 210 |    | 105 |       | 35     |     | −10.0 | −12.3 |

The above test results indicate that the $O_2$ containing plasma etch gas (Run Nos. 1 and 2) resulted in the highest CD loss and for the $O_2$-free etch gases, higher amounts of $SO_2$ when combined with HBr (Run No. 3) resulted in higher CD loss. Lowering the $SO_2$ flow rate for the HBr containing etch gases (Run Nos. 4 and 5) resulted in acceptable CD loss. For the $O_2$-free and HBr-free gases (Run Nos. 6–12), slightly better CD loss values were obtained when the $SO_2$ flow rate was below 100 sccm. Use of argon (Run No. 10) provided similar CD loss results compared to when the carrier gas was helium (Run Nos. 6–9, 11 and 12). The results also indicate that CD loss can be reduced by increasing the RF bias provided by the bottom electrode.

Table 2 sets forth BARC etch rates (ER in Å/minute) using a TCP™ etch chamber as described earlier wherein the chamber pressure was 5 mTorr and the TCP™ power (watts), bottom power (watts), He or Ar flow rate (sccm), $SO_2$ flow rate (sccm), and HBr flow rate (sccm) were as indicated in Table 2. Because the BARC is thin (less than 200 nm), carrier gases such as Ar and/or He can be added in amounts effective to provide a desired etch rate of the BARC.

TABLE 2

| Run | TCP™ | BP  | He/Ar  | $O_2$ | $SO_2$ | HBr | BARC ER |
|-----|------|-----|--------|-------|--------|-----|---------|
| 13  | 350  | 70  | 70 He  | 0     | 50     | 0   | 2616    |
| 14  | 350  | 150 | 105 He | 0     | 35     | 0   | 2534    |
| 15  | 350  | 150 | 70 Ar  | 0     | 50     | 0   | 2638    |

The results set forth in Table 2 indicate that acceptable BARC etch rates can be achieved using only $SO_2$ and a carrier gas such as Ar or He. Increasing the He (Run No. 14) dropped the BARC etch rate somewhat compared to when lower flow rates of Ar and He were used.

In tests carried out to investigate differences in performance between plasma etching with $O_2$ compared to $SO_2$, the optical emission from oxygen atoms was observed during the BARC opening. It was found that the optical emission of oxygen atoms (777.4 nm and 844 nm wavelengths) in oxygen plasma was significantly stronger than the $SO_2$ plasma. These results indicate that molecular oxygen is much easier to dissociate in the plasma than the $SO_2$ gas. Because the oxygen atoms etch the photoresist and BARC isotropically, plasma etching with $O_2$ leads to CD loss.

In etching features in an integrated circuit according to one embodiment of the invention, the BARC can overly a dielectric layer such as silicon nitride or dioxide, SiLK, BPSG, OSG, and low-k materials. Such layers can form part of a damascene structure. During manufacture of such structures, features such as contacts, vias, conductor lines, etc. are etched in dielectric materials such as oxide layers in the manufacture of integrated circuits. The invention overcomes a problem with prior etching techniques wherein the BARC etch led to CD loss, lack of uniformity and loss of profile during etching of the dielectric layers after the BARC etch.

According to one aspect of the invention, the BARC etch can be incorporated in a single or dual-damascene etch process wherein doped and undoped oxide films (BPSG, PSG, TEOS) are etched with 0.25 µm or smaller geometry to an etch depth of at least 1.8 µm. The process can provide a low or reversed RIE lag, which can allow multi-level dielectric etch applications and enable the fabrication of dual-damascene devices.

FIGS. 1A–D show schematics of how a via-first dual-damascene structure can be etched in accordance with the invention. FIG. 1A shows a pre-etch condition wherein an opening 10 corresponding to a via is provided in a photoresist masking layer 12 which overlies a stack of a BARC 13, a first dielectric layer 14 such as silicon oxide, a first stop layer 16 such as silicon nitride, a second dielectric layer 18 such as silicon oxide, a second stop layer 20 such as silicon nitride, and a substrate 22 such as a silicon wafer. FIG. 1B shows the structure after etching wherein the opening 10 extends through the dielectric layers 14, 18 and first stop layer 16 to the second stop layer 20. FIG. 1C shows the structure after re-patterning the masking layer for a trench 24. FIG. 1D shows the structure after etching wherein the first dielectric layer 14 is etched down to the first stop layer 16.

Figures 2C, 2D:
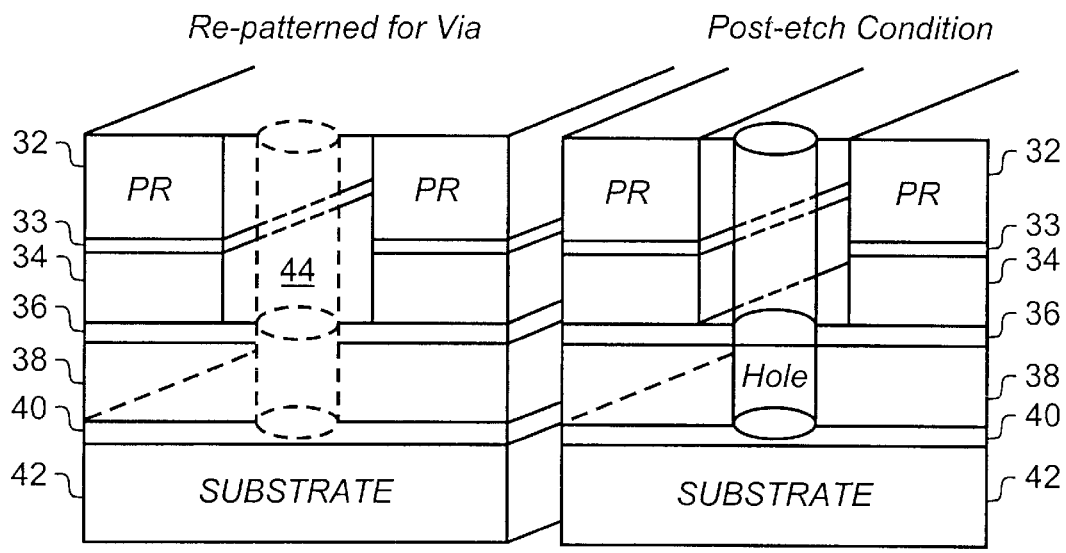

FIGS. 2A–D show schematics of how a trench-first dual-damascene structure can be etched in accordance with the invention. FIG. 2A shows a pre-etch condition wherein an opening 30 corresponding to a trench is provided in a photoresist masking layer 32 which overlies a stack of a BARC 33, a first dielectric layer 34 such as silicon oxide, a first stop layer 36 such as silicon nitride, a second dielectric layer 38 such as silicon oxide, a second stop layer 40 such as silicon nitride, and a substrate 42 such as a silicon wafer. FIG. 2B shows the structure after etching wherein the opening 30 extends through the dielectric layer 34 to the first stop layer 36. FIG. 2C shows the structure after repatterning the masking layer for a via 44. FIG. 2D shows the structure after etching wherein the second dielectric layer 38 is etched down to the second stop layer 40.

Figure 3A:
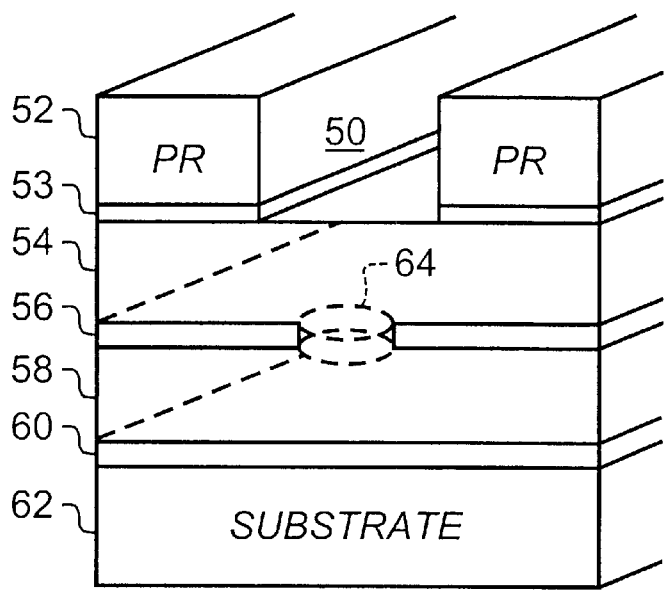
FIGS. 3A–B show schematic representations of a self-aligned dual-damascene structure which can be etched according to the process of the invention, FIG. 3A showing a pre-etch condition and FIG. 3B showing a post-etch condition in which a trench and a via have been etched.
Figure 3B:
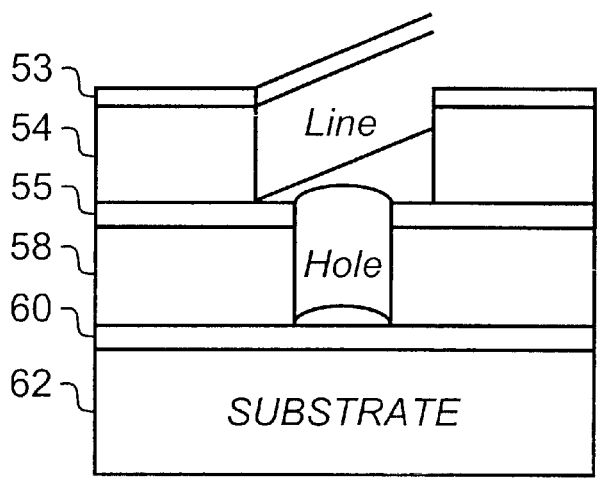

FIGS. 3A–B show schematics of how a dual-damascene structure can be etched in a single step in accordance with the invention. FIG. 3A shows a pre-etch condition wherein an opening 50 corresponding to a trench is provided in a photoresist masking layer 52 which overlies a stack of a BARC 53, a first dielectric layer 54 such as silicon oxide, a first stop layer 56 such as silicon nitride, a second dielectric layer 58 such as silicon oxide, a second stop layer 60 such as silicon nitride, and a substrate 62 such as a silicon wafer. In order to obtain etching of vias through the first stop layer 56 in a single etching step, first stop layer 56 includes an opening 64. FIG. 2B shows the structure after etching wherein the opening 50 extends through the dielectric layer 54 to the first stop layer 56 and the opening 64 extends through the second dielectric 58 to the second stop layer 60. Such an arrangement can be referred to as a "self-aligned dual-damascene" structure.

The process of the invention is applicable to etching of BARC layers over various low-k dielectric layers including doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such as CORAL (a product available from Novellus Systems, Inc.), or other suitable dielectric material having a dielectric constant below 4.0, preferably below 3.0. The low-k dielectric can overlie an intermediate layer such as a barrier layer and a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molydenum silicide, etc.

In another embodiment of the invention, the BARC can overlie a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc. For example, the underlying layer can form part of a gate electrode. As an example, the BARC could be formed over a conductive polysilicon layer having a thickness of 1000 to 3000 Å, the polysilicon layer overlying a gate oxide such as silicon dioxide having a thickness of less than 50 Å, the gate oxide overlying a silicon substrate. In forming a gate electrode pattern, the photoresist is patterned and the BARC is plasma etched in accordance with the process of the invention whereby portions of the BARC are removed until a desired conductor pattern remains above the polysilicon layer. Subsequently, portions of the polysilicon layer are etched away to form a desired conductor pattern on the silicon substrate. If desired, an additional conductive layer such as a silicide layer (e.g., tungsten silicide) can be provided over the polysilicon and the process of the invention can be used to etch a pattern of conductor lines in the BARC which open on the silicide layer.

According to a further embodiment of the invention, the BARC can be provided over a metal conductor layer such as aluminum, copper or alloys thereof. In transferring a pattern such as conductor lines to the metal layer, a photoresist overlying the BARC can be provided with a desired conductor pattern of openings and the BARC can be etched in accordance with the invention to etch the pattern of openings in the BARC until they open on the metal layer.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

Figure 4:
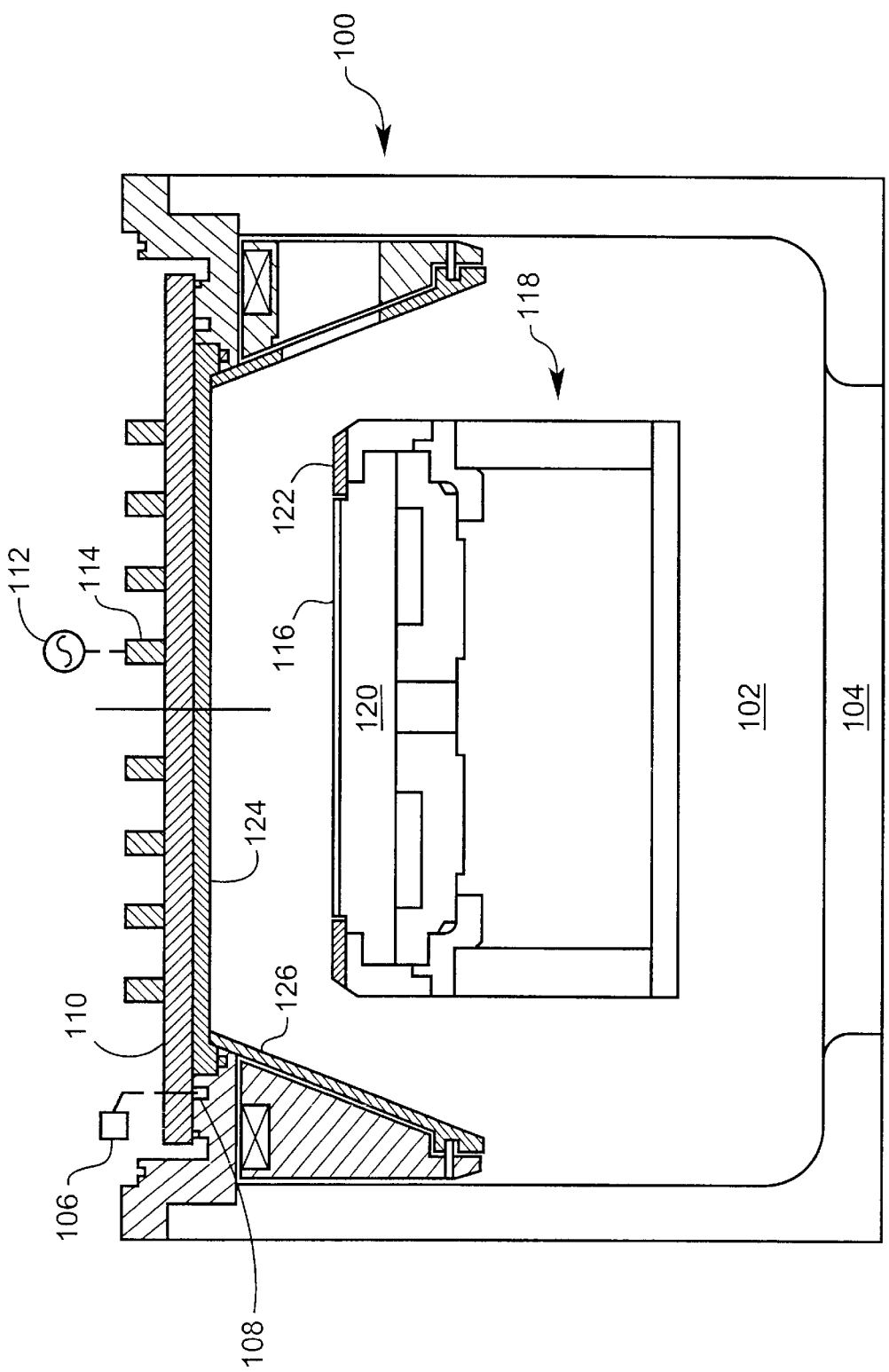
FIG. 4 shows a schematic representation of an inductively coupled high density plasma reactor which can be used to carry out the process of the invention.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a heated cylindrical or conical liner 126 extending conically from the plate 124.

Figure 5:
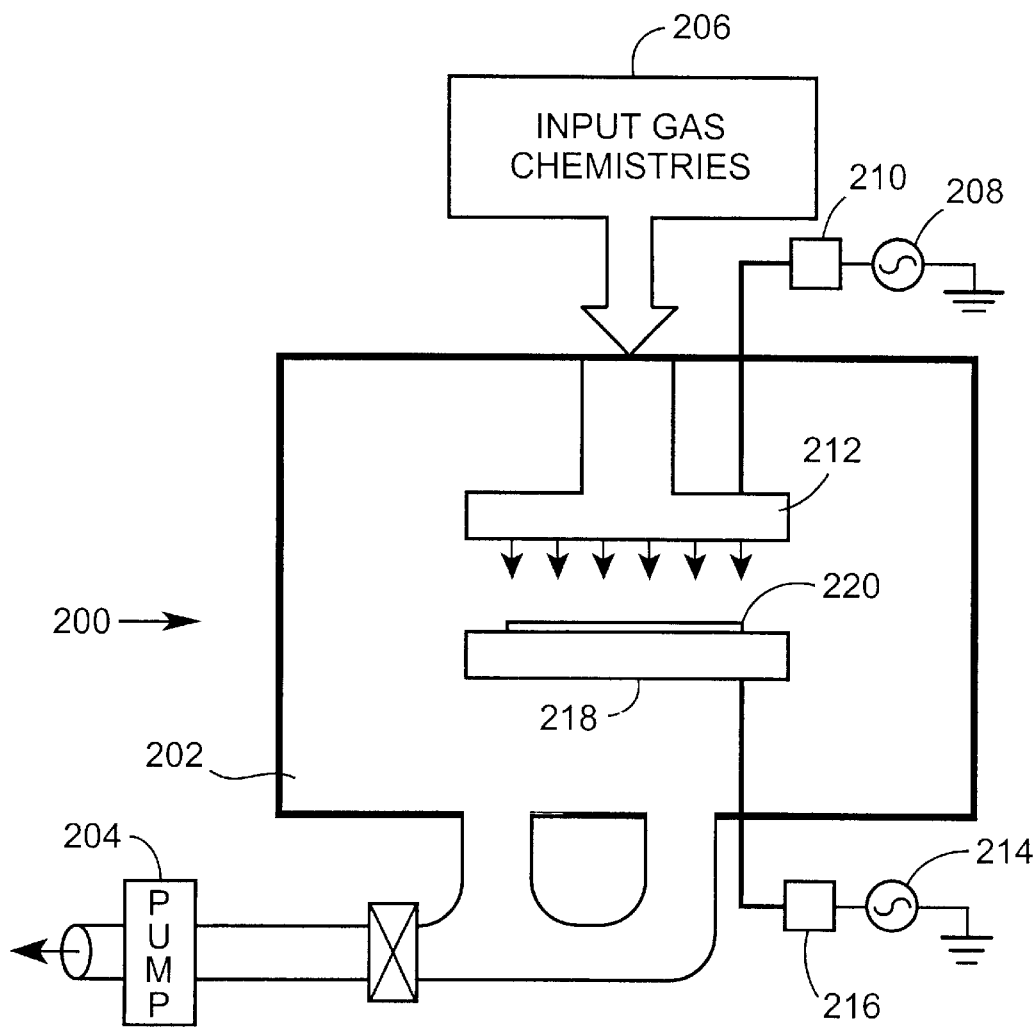
FIG. 5 shows a schematic representation of a medium density parallel plate plasma reactor which can be used to carry out the process of the invention.

The process of the invention can also be carried out in a parallel plate plasma reactor such as reactor 200 shown in FIG. 5. The reactor 200 includes an interior 202 maintained at a desired vacuum pressure by a vacuum pump connected to an outlet 204 in a wall of the reactor. Etching gas can be supplied to a showerhead electrode by supplying gas from gas supply 206. A medium density plasma can be generated in the reactor by supplying RF energy from RF sources 212 to the showerhead electrode and a bottom electrode or the showerhead electrode can be electrically grounded and RF energy at two different frequencies can be supplied to the bottom electrode. Other capacitively coupled etch reactors can also be used such as those having RF power supplied only to a showerhead or upper electrode or only to a bottom electrode.

In one embodiment, the invention provides a process for plasma etching a BARC layer prior to etching 0.3 µm and smaller high aspect ratio features such as conductor lines, vias and contacts including self aligned contacts (SAC) in dielectric, conductive or semiconductive layers on semiconductor substrates. In the process, an $O_2$-free gas mixture containing a sulfur containing gas and a carrier gas (e.g., argon) is energized in a plasma etch reactor into a plasma state. During the etching process, the BARC is etched by the combination of the energized carrier gas and $SO_2$ adsorbed on the BARC, the H and C in the BARC being etched by $O_2$ released from the adsorbed $SO_2$ by impinging ions of the carrier gas.

According to the invention, $SO_2$ is added in an amount effective to control the etch rate selectivity of the etching gas chemistry. That is, when using an etching gas containing $SO_2$, the $SO_2$ etches the BARC without isotropically attacking the overlying photoresist. The etching gas mixture preferably includes an inert carrier gas and optional other gases such as HBr. Argon is an especially useful inert carrier gas which aids the $SO_2$ in attacking the BARC. Other inert gases such as He, Ne, Kr and/or Xe can be used as the inert carrier gas. In order to maintain low pressure in the plasma etching reactor, the amount of carrier gas introduced into the reactor can be at low flow rates. For instance, for a medium to high density plasma reactor, argon can be supplied into the reactor in amounts of 25 to 300 sccm.

In order to provide anisotropic etching, it is beneficial to supply an RF bias to the semiconductor substrate by the substrate support. For instance, an RF biasing electrode in the substrate support can be supplied with power on the order of 50 to 1000 Watts to adequately RF bias 6, 8 or even 12 inch wafers.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 30 mTorr, more preferably below 10 mTorr. For medium density plasma reactors, the reactor is preferably at a pressure above 30 mTorr, more preferably above 80 mTorr. Due to plasma confinement at the seniconductor substrate undergoing etching, the vacuum pressure at the substrate surface may be higher than the vacuum pressure setting for the reactor.

The substrate support supporting the semiconductor substrate undergoing etching preferably cools the substrate enough to prevent burning of any photoresist on the substrate, e.g., maintain the substrate below 140° C. In high and medium density plasma reactors, it is sufficient to cool the substrate support to a temperature of −20°C. to +80° C. The substrate support can include a bottom electrode for supplying an RF bias to the substrate during processing thereof and an ESC for clamping the substrate. For example, the substrate can comprise a silicon wafer which is electrostatically clamped and cooled by supplying helium at a desired pressure between the wafer and top surface of the ESC. In order to maintain the wafer at a desired temperature of, for example, 0 to 100° C., the He can be maintained at a pressure of 2 to 30 Torr in the space between the wafer and the chuck.

During processing of a semiconductor wafer it may be desired to carry one or more of the following steps: BARC etch wherein it is desired to maintain the critical dimension (CD)while using a thin photoresist and remove any oxide, a SiLK Via Etch wherein it is desired to leave 1000 Å SiLK, a Through Mask Etch (nitride) wherein openings are etched into the nitride with selectivity to oxide layers, a second SiLK Etch wherein it is desired to maintain CD with a smooth front and with minimal faceting, and a Nitride Finish Etch wherein the etch is selective to oxide, SiLK and copper.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching an organic antireflective coating with selectivity to an overlying and/or underlying layer, comprising:

supporting a semiconductor substrate in a plasma etch reactor, the substrate including an organic antireflective coating over an underlying layer;

energizing an $O_2$-free etch gas into a plasma state and etching openings in the organic antireflective coating, the etch gas comprising a sulfur-containing gas and a carrier gas.

2. The method of claim 1, wherein the openings comprise vias, contacts, and/or trenches of a dual damascene, self-aligned contact or self-aligned trench structure or conductor lines of a gate electrode.

3. The method of claim 1, wherein the organic antireflective coating is a polymer film having a patterned photoresist thereon, the etch gas minimizing the lateral etch rate of the photoresist to maintain critical dimensions defined by the photoresist.

4. The method of claim 1, wherein the plasma etch reactor comprises an ECR plasma reactor, an inductively coupled plasma reactor, a capacitively coupled plasma reactor, a helicon plasma reactor or a magnetron plasma reactor.

5. The method of claim 1, wherein the plasma etch reactor comprises a high density inductively coupled plasma reactor wherein a planar antenna inductively couples RF energy into the reactor through a dielectric member.

6. The method of claim 1, wherein the sulfur-containing gas is $SO_2$ and the carrier gas is He or Ar.

7. The method of claim 1, wherein the etch gas further comprises HBr.

8. The method of claim 1, wherein pressure in the plasma etch reactor is below 50 mTorr and/or temperature of a substrate support supporting the substrate is −20° C. to +80° C.

9. The method of claim 1, wherein the plasma etch reactor is an inductively coupled plasma reactor having an antenna and a powered bottom electrode, the antenna being supplied 200 to 1000 watts of RF energy and the bottom electrode being supplied 50 to 200 watts of RF energy.

10. The method of claim 1, wherein the etch gas consists essentially of $SO_2$ and He.

11. The method of claim 1, wherein the openings in the organic antireflective coating open on an electrically conductive or semiconductive layer comprising a metal-containing layer selected from the group consisting of doped and undoped polycrystalline or single crystal silicon, aluminum or alloy thereof, copper or alloy thereof, titanium or alloy thereof, tungsten or alloy thereof, molybdenum or alloy thereof, titanium nitride, titanium silicide, tungsten silicide, cobalt silicide, and molybdenum silicide.

12. The method of claim 1, wherein the openings are 0.25 micron or smaller sized openings.

13. The method of claim 1, wherein the carrier gas is selected from the group consisting of Ar, He, Ne, Kr, Xe or mixtures thereof.

14. The method of claim 1, further comprising applying an RF bias to the semiconductor substrate during the etching step.

15. The method of claim 1, further comprising filling the openings with metal after the etching step.

16. The method of claim 1, wherein the etching step is carried out as part of a process of manufacturing a damascene structure, the method further comprising steps of forming a photoresist layer as a masking layer, patterning the photoresist layer to form a plurality of the openings and the etching step forms via or contact openings in the organic antireflective coating.

17. The method of claim 1, wherein the sulfur-containing gas comprises $SO_2$ supplied to the plasma etch reactor at a flow rate of 5 to 200 sccm.

18. The method of claim 17, wherein the carrier gas comprises He or Ar supplied to the plasma etch reactor at a flow rate of 5 to 150 sccm.

19. The method of claim 18, wherein the etch gas further comprises HBr supplied to the plasma etch reactor at a flow rate of 0 to 150 sccm.

20. The method of claim 18, wherein the flow rates of $SO_2$, HBr and He are 5 to 200 sccm $SO_2$, 10 to 50 sccm HBr and 50 to 150 sccm He.

* * * * *

UNITED STATES PATENT AND TRADEMARK OFFICE
CERTIFICATE OF CORRECTION

PATENT NO.   : 6,617,257 B2
DATED        : September 9, 2003
INVENTOR(S)  : Tuqiang Ni et al.

It is certified that error appears in the above-identified patent and that said Letters Patent is hereby corrected as shown below:

Title page,
Item [75], Inventors, "Dai N. Lee" should read -- Dai N. Le --.

Signed and Sealed this

Twentieth Day of July, 2004

JON W. DUDAS
*Acting Director of the United States Patent and Trademark Office*